(12) United States Patent
Watanabe et al.

(10) Patent No.: US 8,823,079 B2
(45) Date of Patent: Sep. 2, 2014

(54) SEMICONDUCTOR DEVICE AND METHOD FOR MANUFACTURING SAME

(71) Applicant: Kabushiki Kaisha Toshiba, Tokyo (JP)

(72) Inventors: Takashi Watanabe, Mie-ken (JP); Jun Takayasu, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/765,941

(22) Filed: Feb. 13, 2013

(65) Prior Publication Data
US 2013/0334590 A1 Dec. 19, 2013

(30) Foreign Application Priority Data

Jun. 13, 2012 (JP) ................................. 2012-133516

(51) Int. Cl.
*H01L 29/792* (2006.01)
*H01L 21/30* (2006.01)
*H01L 21/306* (2006.01)

(52) U.S. Cl.
CPC ........ *H01L 29/792* (2013.01); *H01L 21/30625* (2013.01)
USPC ............................ 257/324; 257/314; 257/316

(58) Field of Classification Search
USPC ......................................... 257/324, 314, 316
See application file for complete search history.

(56) References Cited

U.S. PATENT DOCUMENTS

| | | |
|---|---|---|
| 2003/0116854 A1 | 6/2003 | Ito et al. |
| 2006/0038297 A1 | 2/2006 | Usami et al. |
| 2006/0231884 A1 | 10/2006 | Yonemochi et al. |
| 2009/0068840 A1 | 3/2009 | Minamihaba et al. |
| 2010/0072581 A1 | 3/2010 | Nakasaki et al. |
| 2012/0007165 A1* | 1/2012 | Lee et al. ...................... 257/316 |
| 2012/0032323 A1* | 2/2012 | Matsumoto et al. .......... 257/737 |

FOREIGN PATENT DOCUMENTS

| | | |
|---|---|---|
| JP | 2001-230244 | 8/2001 |
| JP | 2010-87160 | 4/2010 |
| JP | 2010-147410 | 7/2010 |
| JP | 2012-114483 | 6/2012 |

* cited by examiner

*Primary Examiner* — Mamadou Diallo
(74) *Attorney, Agent, or Firm* — Oblon, Spivak, McClelland, Maier & Neustadt, L.L.P.

(57) ABSTRACT

According to one embodiment, a semiconductor device includes a substrate, a foundation structure, a first insulating film, and a second insulating film. The foundation structure is provided on the substrate. The foundation structure includes a plurality of circuit components and a gap provided between the circuit components. The first insulating film is provided on the foundation structure. The second insulating film is provided on the first insulating film. A Young's modulus of the second insulating film is lower than a Young's modulus of the first insulating film and a Young's modulus of a silicon oxide film.

19 Claims, 8 Drawing Sheets

US 8,823,079 B2

SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2012-133516, filed on Jun. 13, 2012; the entire contents of which are incorporated herein by reference.

FIELD

Embodiments described herein relate generally to a semiconductor device and a method for manufacturing a semiconductor device.

BACKGROUND

The downscaling of element structures and interconnect structures is being pursued to achieve higher performance, higher capacity, and lower costs of semiconductor devices. For example, in a semiconductor memory device having a floating gate structure, downscaling of the arrangement pitches of the floating gates and the metal interconnects is progressing. Reducing the space between the gates, the space between the interconnects, or the element-separating region may cause problems due to the increase of the coupling capacitance, e.g., fluctuation of the threshold current of memory cells.

Therefore, an air gap structure has been proposed in which air (relative dielectric constant $\in=1$) is provided in the space between the gates, in the space between the interconnects, or in the element-separating region because the relative dielectric constant of air is lower than that of a silicon oxide film (relative dielectric constant $\in=3.9$) which is widely used as the insulating film material in the space between the gates, in the space between the interconnects, or in the element-separating region.

DETAILED DESCRIPTION

Figure 1A:
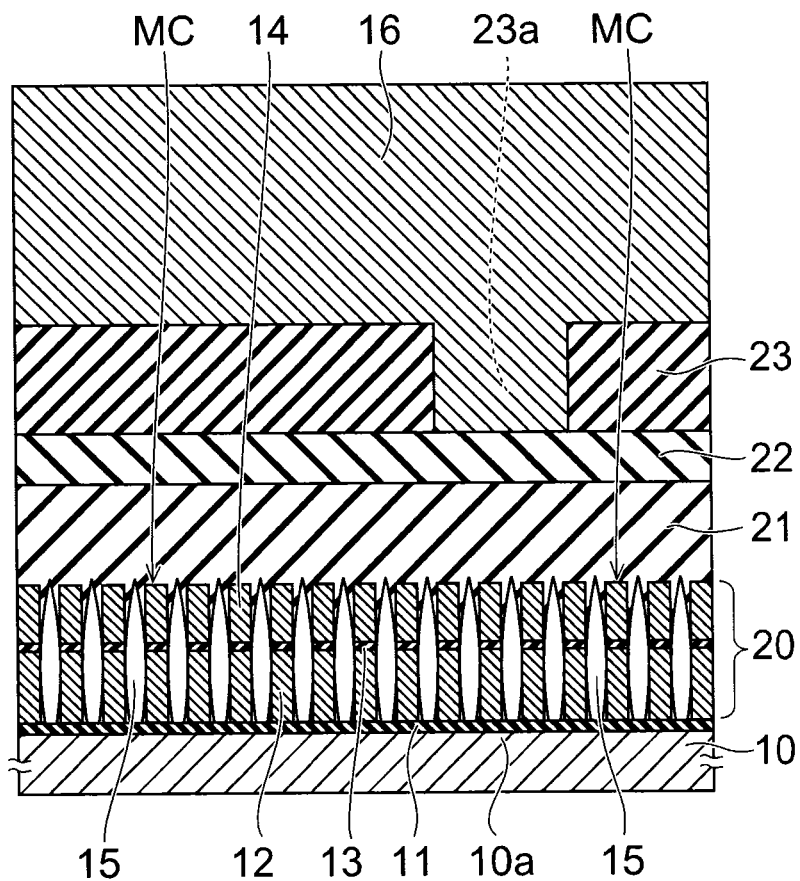
FIGS. 1A and 1B are schematic cross-sectional views showing a method for manufacturing a semiconductor device of a first embodiment.

According to one embodiment, a semiconductor device includes a substrate, a foundation structure, a first insulating film, and a second insulating film. The foundation structure is provided on the substrate. The foundation structure includes a plurality of circuit components and a gap provided between the circuit components. The first insulating film is provided on the foundation structure. The second insulating film is provided on the first insulating film. A Young's modulus of the second insulating film is lower than a Young's modulus of the first insulating film and a Young's modulus of a silicon oxide film.

Embodiments will now be described with reference to the drawings. Similar components in the drawings are marked with like reference numerals.

First Embodiment

Figure 1B:
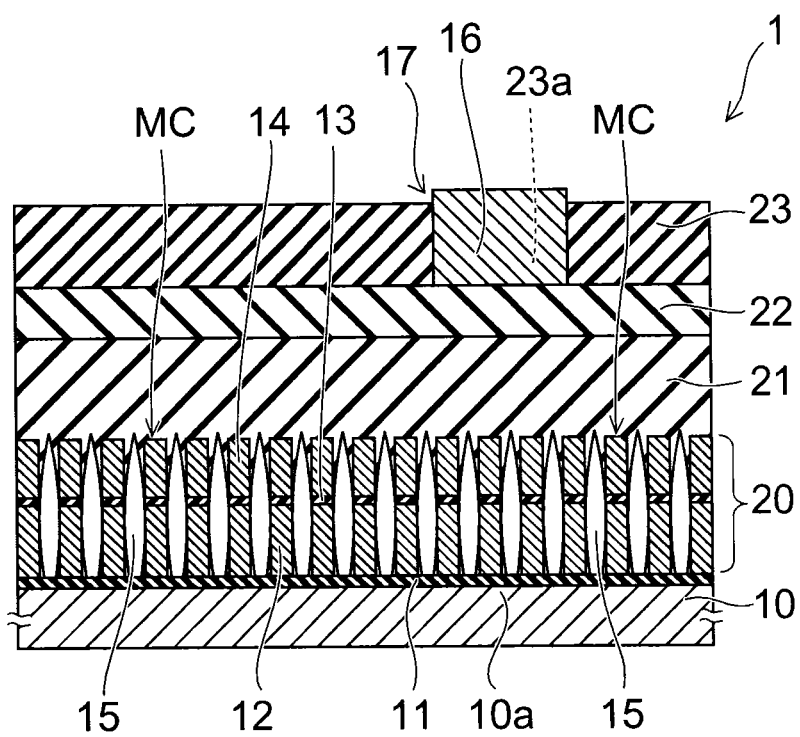

FIG. 1B is a schematic cross-sectional view of a semiconductor device 1 of a first embodiment.

The semiconductor device 1 includes a substrate 10, a foundation structure 20 provided on the substrate 10, and an upper layer structure provided on the foundation structure 20.

The semiconductor device 1 is, for example, a nonvolatile semiconductor memory device; and the foundation structure 20 includes multiple memory cells MC as circuit components.

The substrate 10 is, for example, a silicon substrate; and an active region (or a channel region) 10a is formed at the surface of the substrate 10 or at the surface of a semiconductor well layer formed at the surface of the substrate 10.

An insulating film 11 is provided on the active region 10a. The insulating film 11 is, for example, a silicon oxide film. The multiple memory cells MC are provided on the insulating film 11 and are separated from each other.

The memory cell MC includes the active region 10a, the insulating film 11, a charge storage layer 12 provided on the insulating film 11, an intermediate insulating film 13 provided on the charge storage layer 12, and a control gate electrode 14 provided on the intermediate insulating film 13. The charge storage layer 12 is, for example, a floating gate electrode, a trap insulating film, or a stacked film of a floating gate electrode and a trap insulating film.

The active regions 10a and the control gate electrodes 14 cross (e.g., are orthogonal) when the substrate 10 is viewed in plan from above in FIG. 1B; and the charge storage layers 12 are positioned at the intersections of the active regions 10a and the control gate electrodes 14. In other words, the multiple memory cells MC are laid out in a matrix configuration on the substrate 10; and one memory cell MC includes one charge storage layer 12 with an insulator (including gaps) provided around the charge storage layer 12.

The charge storage layer 12 is covered with an insulator and has no electrical connections. Therefore, even when the power supply is OFF, the electrons stored in the charge storage layer 12 do not leak out from the charge storage layer 12; and new electrons do not enter. In other words, the semiconductor device 1 is a nonvolatile semiconductor memory device that can retain data without supplying the power supply.

A gap 15 having a relative dielectric constant that is lower than that of the silicon oxide film is provided between the multiple memory cells MC to suppress the interference between the memory cells MC.

An insulating film (a first insulating film) 21 is provided on the foundation structure 20 including the memory cells MC and the gaps 15. The insulating film 21 is, for example, a silicon oxide film.

An insulating film (a second insulating film) 22 is provided on the insulating film 21. The Young's modulus of the insulating film 22 is lower than the Young's modulus of the insulating film 21 and is lower than the Young's modulus of the silicon oxide film.

The insulating film (the low-Young's-modulus film) 22 is, for example, an organic polymer film, an organosilicon film, or a SiOC film (a carbon-doped silicon oxide film).

An insulating film (a third insulating film) 23 is provided on the insulating film 22. The Young's modulus of the insulating film 23 is higher than the Young's modulus of the insulating film 22; and the insulating film 23 is, for example, a silicon oxide film.

An interconnect layer 16 is filled into the insulating film 23. The interconnect layer 16 is, for example, a metal film such as a tungsten film, etc.

The insulating film 23 is formed on the entire surface of the insulating film 22; subsequently, an interconnect trench 23a is made in the insulating film 23 to reach the insulating film 22; and the interconnect layer 16 is filled into the interconnect trench 23a. The interconnect layer 16 is provided on the insulating film 22 inside the interconnect trench 23a such that the insulating film 23 covers the interconnect layer 16 and is provided around the interconnect layer 16.

The semiconductor device 1 of the first embodiment includes the foundation structure 20 which has an air gap structure in which the gaps 15 are provided between the memory cells MC. The mechanical strength of the air gap structure is less than that of a structure in which an insulating film is filled between the memory cells MC. The configurations of the gaps 15 tend to be made with sharp upper ends; and stress concentrates easily at the upper ends of the gaps 15.

Therefore, in the CMP (chemical mechanical polishing) process that is implemented after forming the foundation structure 20 including the gaps 15 to remove the excessive portion of the interconnect layer 16 formed at the upper layer and planarize the upper layer surface to eliminate stepped portions, there is a risk that problems may occur such as destruction of the foundation structure 20 due to cracks having the upper ends of the gaps 15 as starting points occurring due to stress concentrating at the upper ends of the gaps 15.

A method for manufacturing a semiconductor device of a comparative example will now be described with reference to FIGS. 8A to 8C with a focus on the CMP process.

Figure 8A:
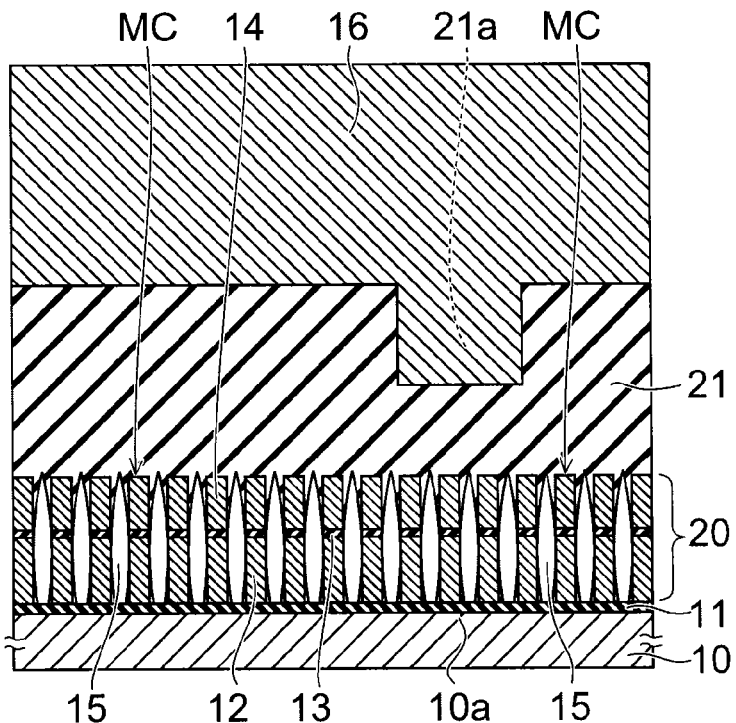
FIG. 8A to FIG. 8C are schematic cross-sectional views showing a method for manufacturing a semiconductor device of a comparative example.

As shown in FIG. 8A, the insulating film 21 is formed on the memory cells MC after forming the multiple memory cells MC on the substrate 10. By controlling the film formation conditions of the insulating film 21, the insulating film 21 can be formed on the memory cells MC to cause the gaps 15 to occur between the memory cells MC. The insulating film 21 is a silicon oxide film.

Then, after making an interconnect trench 21a in the surface of the insulating film 21, a tungsten film used to form the interconnect layer 16 is formed inside the interconnect trench 21a and on the insulating film 21.

Figure 8B:
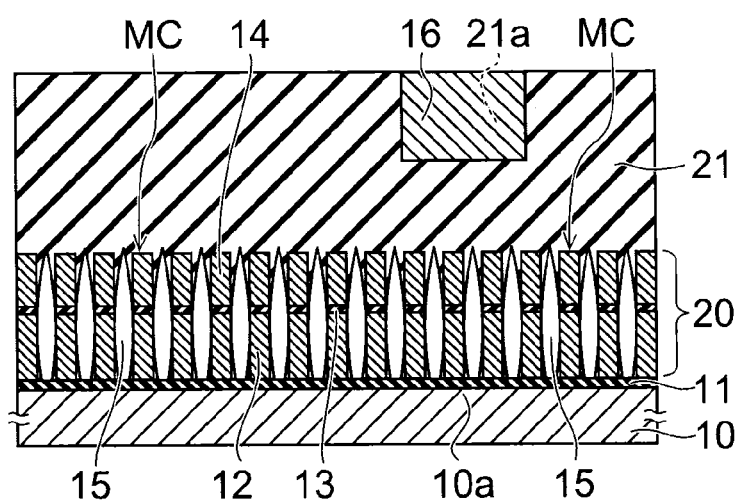

Then, as shown in FIG. 8B, a CMP process is performed on the stacked body (the wafer) shown in FIG. 8A to polish the excessive interconnect layer 16 on the insulating film 21 to remove the excessive interconnect layer 16 on the insulating film 21 and leave the interconnect layer 16 only inside the interconnect trench 21a. In the comparative example, the CMP is performed on the wafer having the structure (the structure of FIG. 8A) in which all of the insulating films 21 on the foundation structure 20 are silicon oxide films.

As shown in FIG. 8B, polishing of the excessive interconnect layer 16 on the insulating film 21 is performed until the insulating film 21 is exposed. Subsequently, as shown in FIG. 8C, polishing is performed to further remove the insulating film 21 that is exposed. This is to reliably remove the interconnect layer 16 existing in recesses of the surface of the insulating film 21 and prevent the interconnect layer 16 outside the interconnect trench 21a from remaining.

A stepped portion forms between the surface of the insulating film 21 and the surface of the interconnect layer 16 due to the difference of polishing rates between the interconnect layer 16 and the insulating film 21. Because the polishing rate of the insulating film 21 is higher than the polishing rate of the interconnect layer 16 in the comparative example, the surface of the insulating film 21 recedes slightly from the surface of the interconnect layer 16 toward the substrate 10 side; and a stepped portion 17 forms between the interconnect layer 16 and the insulating film 21.

In the CMP process recited above, particles inside a slurry that is supplied to the wafer surface are pressed onto the wafer surface by a polishing pad to apply a load to the wafer.

Figure 2A:
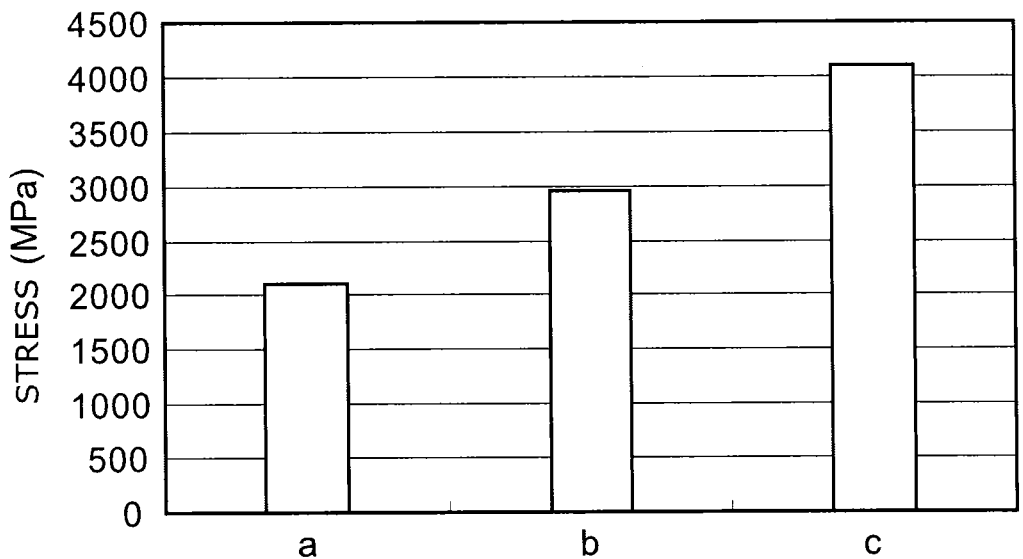
FIG. 2A is a graph showing simulation results of stress applied to an upper end of a gap in the CMP process of the stage of FIG. 8C.
Figure 8C:
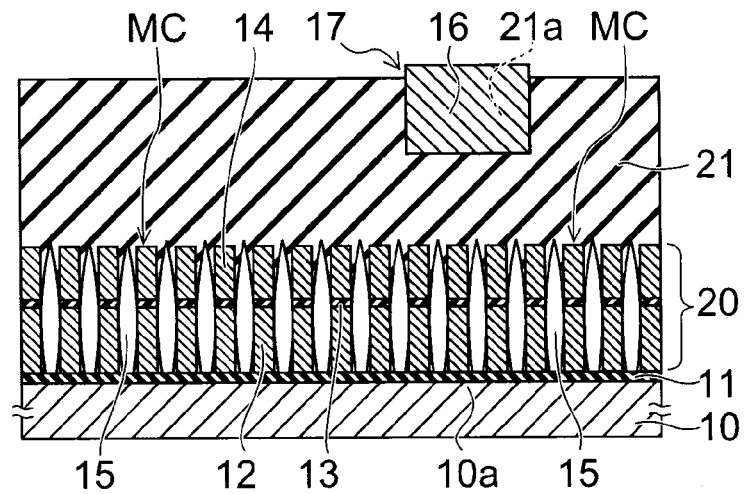

FIG. 2A is a graph showing simulation results of stress (MPa) applied to the gap 15 upper end in the CMP process of FIG. 8C. The calculations are performed using 94 (GPa) as the Young's modulus of the insulating film 21 which is the silicon oxide film.

Graph a shows the stress applied to the gap 15 upper end when the particles inside the slurry are pressed onto the interconnect layer (the tungsten film) 16 surface in the CMP in the state of FIG. 8C.

Graph b shows the stress applied to the gap 15 upper end when the particles inside the slurry are pressed onto the exposed insulating film (silicon oxide film) 21 surface in the CMP in the state of FIG. 8C.

Graph c shows the stress applied to the gap 15 upper end when the particles inside the slurry are pressed onto the stepped portion 17 between the interconnect layer 16 and the insulating film 21 in the CMP in the state of FIG. 8C.

According to the simulation results of FIG. 2A, the stress applied to the gap 15 upper end tends to be the largest when the stepped portion 17 forms between the interconnect layer 16 and the insulating film 21 and the particles inside the slurry are pressed onto the stepped portion 17. In other words, cracks having the gaps 15 as starting points occur easily in the case where the stepped portion between the interconnect layer 16 and the insulating film 21 forms easily in the CMP process when forming the interconnect layer 16.

A method for manufacturing the semiconductor device 1 of the first embodiment will now be described with reference to FIGS. 1A and 1B with a focus on the CMP process.

As shown in FIG. 1A, the insulating film 21 is formed on the memory cells MC after forming the multiple memory cells MC on the substrate 10. By controlling the film formation conditions of the insulating film 21, the insulating film 21 can be formed on the memory cells MC to cause the gaps 15 to occur between the memory cells MC. The insulating film 21 is a silicon oxide film; and the film thickness of the insulating film 21 is 140 nm.

Then, the insulating film (the low-Young's-modulus film) 22 such as the organic polymer film, the organosilicon film, the SiOC film, etc., having the Young's modulus that is lower than that of the silicon oxide film is formed on the insulating film 21. The film thickness of the insulating film 22 is 70 nm.

Continuing, the insulating film 23 having the Young's modulus that is higher than that of the insulating film 22 is formed on the insulating film 22. The insulating film 23 is a silicon oxide film; and the film thickness of the insulating film 23 is 105 nm.

The insulating film 23 is formed on the entire surface of the insulating film 22. Subsequently, the interconnect trench 23a is made in a portion of the insulating film 23; and the interconnect layer 16 is formed inside the interconnect trench 23a and on the insulating film 23. The interconnect layer 16 is a tungsten film; and the film thickness of the tungsten film on the insulating film 23 is 250 nm.

Then, a CMP process is performed on the stacked body (the wafer) shown in FIG. 1A to polish the excessive interconnect layer 16 on the insulating film 23 to remove the excessive interconnect layer 16 on the insulating film 23 and leave the interconnect layer 16 only inside the interconnect trench 23a.

Figure 7:
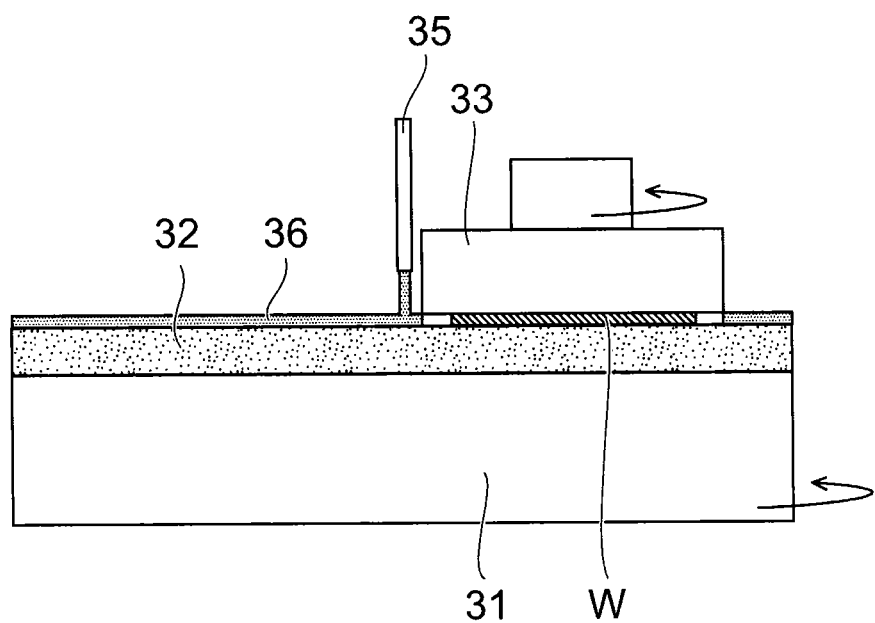
FIG. 7 is a schematic view of a CMP apparatus.

Here, FIG. 7 is a schematic view of a CMP apparatus.

The CMP apparatus includes a rotating table 31, a polishing pad 32, a polishing head 33, and a nozzle 35. The polishing pad 32 is adhered to the upper surface of the rotating table 31. The polishing pad 32 rotates as a single body with the rotating table 31 when the rotating table 31 rotates.

The polishing head 33 is provided above the polishing pad 32. A wafer W having the stacked structure shown in FIG. 1A which is the object to be polished is held by the polishing head 33 with the surface to be polished (the interconnect layer 16 surface) of the wafer W opposing the polishing pad 32. The wafer W held by the polishing head 33 moves horizontally, ascends and descends, and rotates as a single body with the polishing head 33.

The nozzle 35 is provided above the polishing pad 32. A slurry which is, for example, an abrasive of silica particles, etc., or a polishing liquid including abrasives is dispensed from the nozzle 35.

The rotating table 31 and the polishing head 33 are rotated during the polishing operation. Accordingly, the polishing pad 32 and the wafer W are rotated. The rotating wafer W is polished in contact with the upper surface of the rotating polishing pad 32. At this time, the polishing head 33 presses the wafer W onto the upper surface of the polishing pad 32.

From the state of FIG. 1A, polishing of the excessive interconnect layer 16 on the insulating film 23 is performed until the insulating film 23 is exposed. Subsequently, as shown in FIG. 1B, polishing is performed to further remove the exposed insulating film 23. This is to reliably remove the interconnect layer 16 existing in recesses of the surface of the insulating film 23 and prevent the interconnect layer 16 outside the interconnect trench 23a from remaining.

A stepped portion forms between the surface of the insulating film 23 and the surface of the interconnect layer 16 due to the difference of polishing rates between the interconnect layer 16 and the insulating film 23. Because the polishing rate of the insulating film 23 is higher than the polishing rate of the interconnect layer 16 in the embodiment, the surface of the insulating film 23 is receded slightly from the surface of the interconnect layer 16 toward the substrate 10 side; and the stepped portion 17 forms between the interconnect layer 16 and the insulating film 23.

According to the first embodiment, the insulating film 22 which has the Young's modulus that is lower than that of the silicon oxide film, that is, is softer than the silicon oxide film, is provided on the foundation structure 20 including the gaps 15. Therefore, by the insulating film 22 deforming in the CMP process recited above, the load applied to the wafer is absorbed; and the stress on the gaps 15 provided under the insulating film 22 is reduced. The reduction of the stress applied to the gaps 15 suppresses the occurrence of the cracks; and the semiconductor device 1 having high reliability can be provided.

Figure 2B:
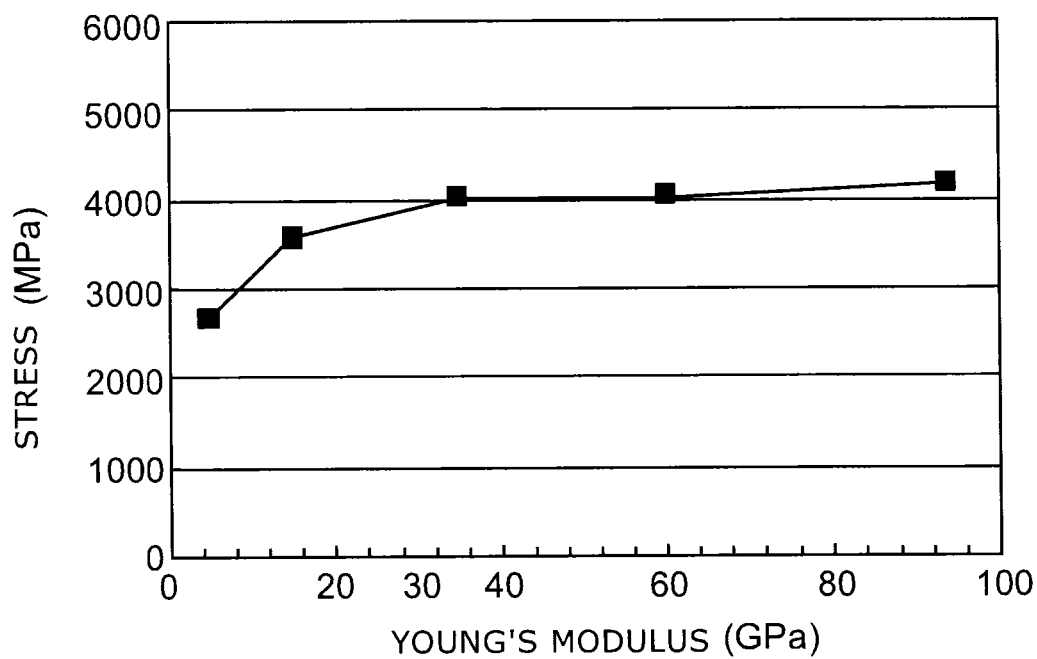
FIG. 2B is a graph showing simulation results of relationship between stress applied to an upper end of a gap in the CMP process of the stage of FIG. 1B and the Young's modulus of an insulating film 22.

FIG. 2B is a graph showing simulation results of the relationship between stress (MPa) applied to the gap 15 upper end in the CMP process of the stage of FIG. 1B and the Young's modulus (GPa) of the insulating film 22.

According to the simulation results, it can be seen that the decrease of the stress applied to the gap 15 upper end is more pronounced in the region where the Young's modulus of the insulating film 22 is not more than 30 GPa than in the region where the Young's modulus is higher than 30 GPa. Accordingly, the suppression effect of the cracks can be increased by providing the insulating film 22 which has the Young's modulus of not more than 30 GPa between the surface to be polished and the foundation structure 20. However, the insulating film 22 has a hardness (a Young's modulus) such that the Young's modulus is within a range that is not more than 30 GPa but is high enough that the insulating film 22 does not peel in the CMP process.

A SiOC film having a Young's modulus of 12 to 15 GPa may be used as such an insulating film 22. Or, an organic polymer material such as polyarylether having a Young's modulus of 2 to 6 GPa, polyimide having a Young's modulus of 3 to 5 GPa, etc., may be used as the insulating film 22. Further, an organosilicon material such as methylsilsesquioxane having a Young's modulus of 2 to 8 GPa, etc., may be used as the insulating film 22.

It is possible to measure the Young's modulus of the insulating film 22 by, for example, nanoindentation, etc.

According to the first embodiment, the insulating film 21 and the insulating film 23, which are harder than the insulating film 22 and have the Young's moduli which are higher than that of the insulating film 22, are provided on and under the insulating film 22, which is relatively soft and has the relatively low Young's modulus. In other words, for example, the insulating film 22 which is soft and has the Young's modulus of not more than 30 GPa is interposed between the insulating film 21 and the insulating film 23, which are harder than the insulating film 22 and have, for example, the Young's moduli exceeding 30 GPa. Thereby, the mechanical strength of the insulating film 22 is reinforced; and the peeling of the insulating film 22 in the CMP can be prevented.

The undesirable movement of the interconnect layer 16 due to the deformation of the insulating film 23 in the CMP can be suppressed by the insulating film 23 that is provided around the interconnect layer 16 being harder than the insulating film 22.

By the insulating film 21 that is directly above the gaps 15 being harder than the insulating film 22, the deformation of the insulating film 21 in the CMP is suppressed; and the stress on the gaps 15 can be suppressed.

Second Embodiment

Figure 3A:
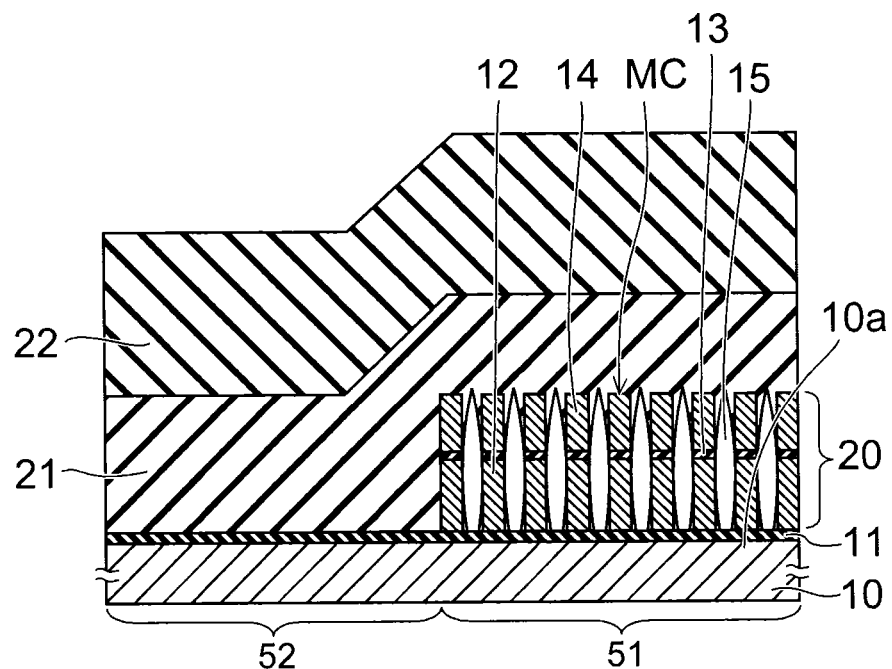
FIGS. 3A and 3B are schematic cross-sectional views showing a method for manufacturing a semiconductor device of a second embodiment.
Figure 3B:
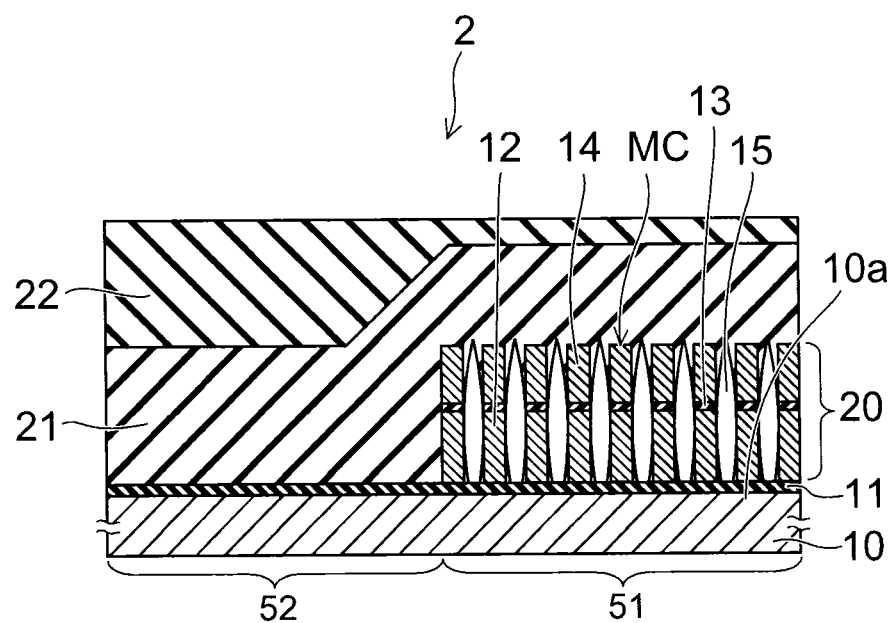

FIG. 3B is a schematic cross-sectional view of a semiconductor device 2 of a second embodiment.

The substrate 10 of the semiconductor device 2 of the second embodiment has a first region 51 where the foundation structure 20 is provided, and a second region 52 where the insulating film 21 is provided without the foundation structure 20 interposed.

Similarly to the first embodiment, the memory cell MC including the stacked film of the charge storage layer 12, the intermediate insulating film 13, and the control gate electrode 14 is multiply provided in the first region 51. The gaps 15 are provided between the memory cells MC in the first region 51.

In the second region 52, the insulating film 21 is provided on the substrate 10 with the insulating film 11 interposed. The insulating film 21 is a silicon oxide film; and the film thickness of the insulating film 21 is 140 nm.

The foundation structure 20 including the memory cells MC and the gaps 15 is provided in the first region 51; and the foundation structure 20 is not provided in the second region 52. Accordingly, a stepped portion forms in the surface of the insulating film 21 that is formed on the entire surface of the substrate 10 to cover the foundation structure 20. A peripheral circuit may be provided in the second region 52.

The insulating film 22 having a Young's modulus that is lower than that of a silicon oxide film is provided on the insulating film 21. A film of the same material as that of the first embodiment may be used as the insulating film 22. The insulating film 22 covers the surface step of the insulating film 21; and the surface of the insulating film 22 is polished by CMP to be planarized.

First, as shown in FIG. 3A, the insulating film 22 is formed on the insulating film 21 along the surface step of the insulating film 21 with a film thickness of 175 nm; and a stepped portion forms also in the surface of the insulating film 22 to reflect the surface step of the insulating film 21.

The CMP of the stacked body (the wafer) shown in FIG. 3A is performed because the surface step causes pattern defects in the lithography of the interconnect layer formation process of the upper layer and metal residue in the CMP process.

In the CMP apparatus shown in FIG. 7 described above, the wafer W having the stacked structure shown in FIG. 3A which is the object to be polished is held by the polishing head 33 with the surface to be polished (the insulating film 22 surface) of the wafer W opposing the polishing pad 32.

Then, the wafer W which is rotating as a single body with the polishing head 33 is polished by being pressed onto the upper surface of the rotating polishing pad 32; and the surface of the insulating film 22 is planarized as shown in FIG. 3B.

In the second embodiment as well, the insulating film 22 which has the Young's modulus that is lower than that of the silicon oxide film, that is, is softer than the silicon oxide film, is provided on the foundation structure 20 including the gaps 15. Therefore, the load applied to the wafer by the insulating film 22 deforming in the CMP process is absorbed; and the stress on the gaps 15 provided under the insulating film 22 is reduced. The reduction of the stress applied to the gaps 15 suppresses the occurrence of the cracks; and the semiconductor device 2 having high reliability can be provided.

Figure 4:
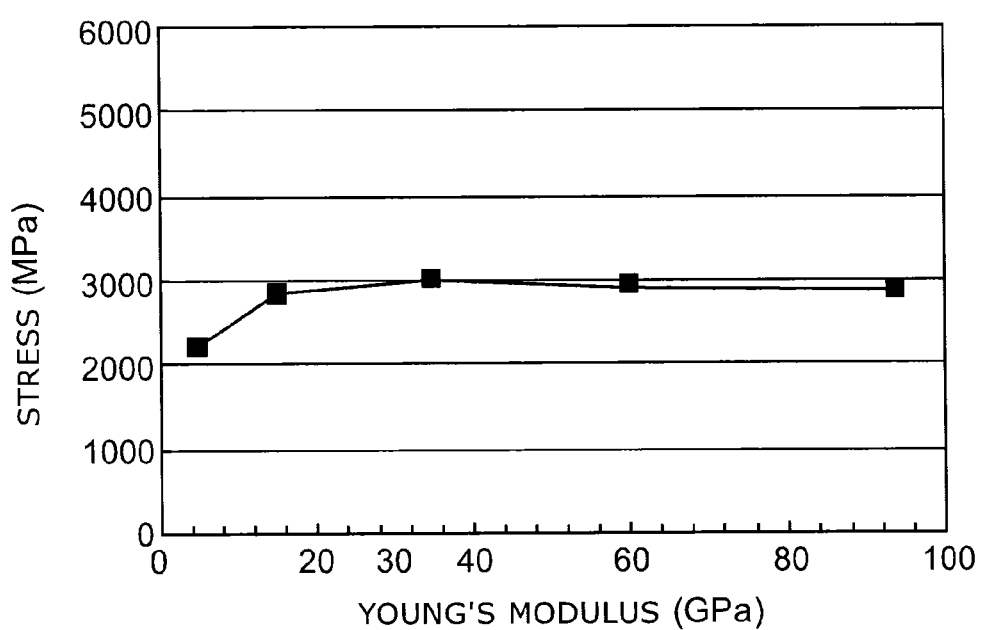
FIG. 4 is a graph showing simulation results of relationship between stress applied to an upper end of a gap in the CMP process of the stage of FIGS. 3A to 3B and the Young's modulus of an insulating film 22.

FIG. 4 is a graph showing simulation results of the relationship between stress (MPa) applied to the gap 15 upper end in the CMP process of FIGS. 3A to 3B and the Young's modulus (GPa) of the insulating film 22.

According to the simulation results, it can be seen that the decrease of the stress applied to the gap 15 upper end is more pronounced in the region where the Young's modulus of the insulating film 22 is not more than 30 GPa, and more favorably, not more than 15 GPa than in the region where the Young's modulus is higher than 30 GPa. Accordingly, the suppression effect of the cracks can be increased by providing the insulating film 22 which has the Young's modulus of not more than 30 GPa between the surface to be polished and the foundation structure 20. However, the insulating film 22 has a hardness (a Young's modulus) such that the Young's modulus is within a range that is not more than 30 GPa but is high enough that the insulating film 22 does not peel in the CMP process.

By the insulating film 21 that is directly above the gaps 15 being harder than the insulating film 22, the deformation of the insulating film 21 in the CMP is suppressed; and the stress on the gaps 15 can be suppressed.

Third Embodiment

Figure 5A:
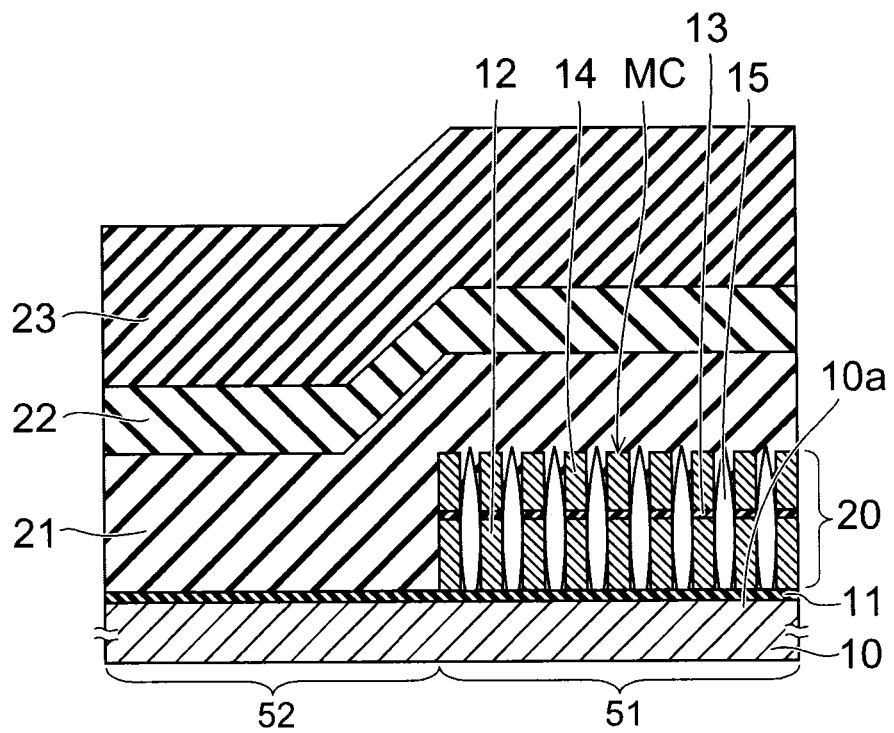
FIGS. 5A and 5B are schematic cross-sectional views showing a method for manufacturing a semiconductor device of a third embodiment.
Figure 5B:
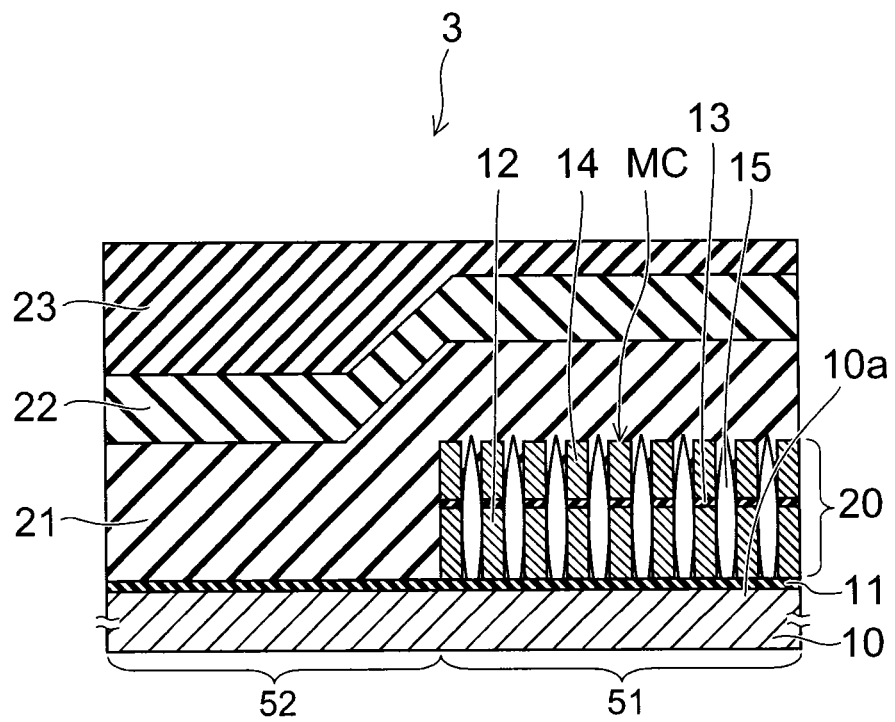

FIG. 5B is a schematic cross-sectional view of a semiconductor device 3 of a third embodiment.

In the semiconductor device 3 of the third embodiment as well, similarly to the second embodiment, the substrate 10 has the first region 51 where the foundation structure 20 is provided, and the second region 52 where the insulating film 21 is provided without the foundation structure 20 interposed.

A stepped portion caused by the existence and absence of the foundation structure 20 forms in the surface of the insulating film 21; and a stepped portion that reflects the surface step of the insulating film 21 forms in the surface of the insulating film 22 provided on the surface of the insulating film 21.

In the semiconductor device 3 of the third embodiment, the insulating film 23 which is the silicon oxide film having the Young's modulus that is higher than that of the insulating film 22 is further provided on the insulating film 22. The insulating film 23 covers the surface step of the insulating film 22; and the surface of the insulating film 23 is polished by CMP to be planarized.

First, as shown in FIG. 5A, the insulating film 23 is formed on the insulating film 22 along the surface step of the insulating film 22; and a stepped portion that reflects the surface step of the insulating film 22 forms in the surface of the insulating film 23.

Similarly to the second embodiment, CMP is performed on the stacked body (the wafer) shown in FIG. 5A because the surface step causes pattern defects in the lithography of the interconnect layer formation process of the upper layer and metal residue in the CMP process.

In the CMP apparatus shown in FIG. 7 described above, the wafer W having the stacked structure shown in FIG. 5A which is the object to be polished is held by the polishing head 33 with the surface to be polished (the insulating film 23 surface) of the wafer W opposing the polishing pad 32.

Then, the wafer W which is rotating as a single body with the polishing head 33 is polished by being pressed onto the upper surface of the rotating polishing pad 32; and the surface of the insulating film 23 is planarized as shown in FIG. 5B.

In the third embodiment as well, the insulating film 22 which has the Young's modulus that is lower than that of the silicon oxide film, that is, is softer than the silicon oxide film, is provided on the foundation structure 20 including the gaps 15. Therefore, the load applied to the wafer by the insulating film 22 deforming in the CMP process is absorbed; and the stress on the gaps 15 provided under the insulating film 22 is reduced. The reduction of the stress applied to the gaps 15 suppresses the occurrence of the cracks; and the semiconductor device 3 having high reliability can be provided.

In the third embodiment as well, from an examination based on the simulation results of FIG. 2B and FIG. 4 described above, it is desirable for the Young's modulus of the insulating film 22 to be not more than 30 GPa and not less than a hardness (a Young's modulus) that is high enough that the insulating film 22 does not peel in the CMP process.

According to the third embodiment, the insulating film 21 and the insulating film 23, which are harder than the insulating film 22 and have the Young's moduli which are higher than that of the insulating film 22, are provided on and under the insulating film 22, which is relatively soft and has the relatively low Young's modulus. The mechanical strength of the insulating film 22 is reinforced by the insulating film 22 being interposed between the insulating film 21 and the insulating film 23, where the insulating film 22 is relatively soft, and the insulating film 21 and the insulating film 23 are harder than the insulating film 22; and the peeling of the insulating film 22 in the CMP can be prevented.

By the insulating film 21 that is directly above the gaps 15 being harder than the insulating film 22, the deformation of the insulating film 21 in the CMP is suppressed; and the stress on the gaps 15 can be suppressed.

In the third embodiment, the insulating film 23 is the component to be polished. Irregular polishing due to the polishing liquid having water as the solvent being undesirably repelled on the surface to be polished can be suppressed because the insulating film 23, which is the silicon oxide film, is more hydrophilic than the insulating film 22 which includes the material such as the SiOC, the organic polymer material, the organosilicon material, etc.

Fourth Embodiment

Figure 6A:
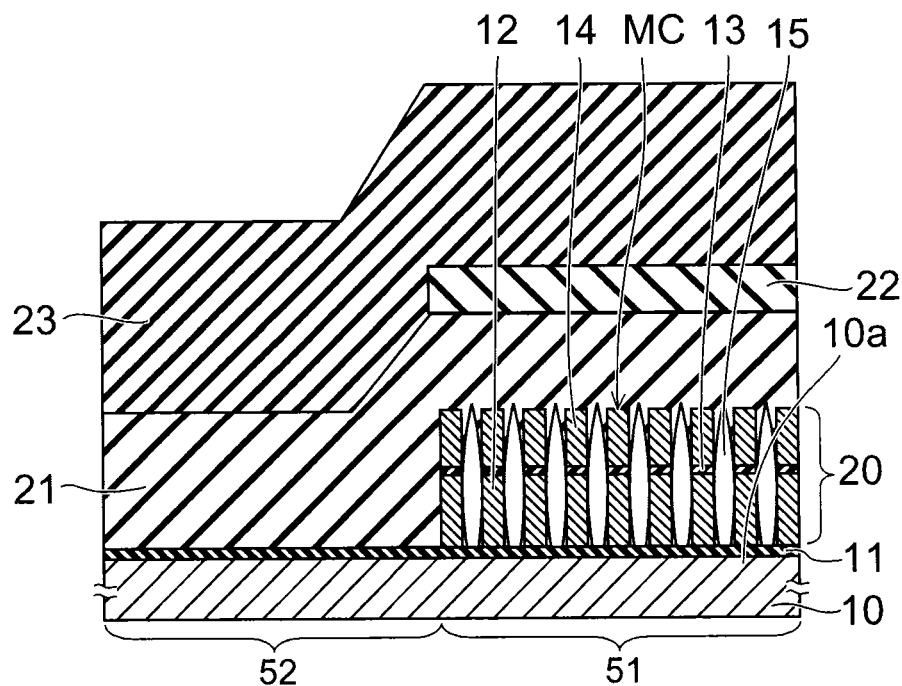
FIGS. 6A and 6B are schematic cross-sectional views showing a method for manufacturing a semiconductor device of a fourth embodiment.
Figure 6B:
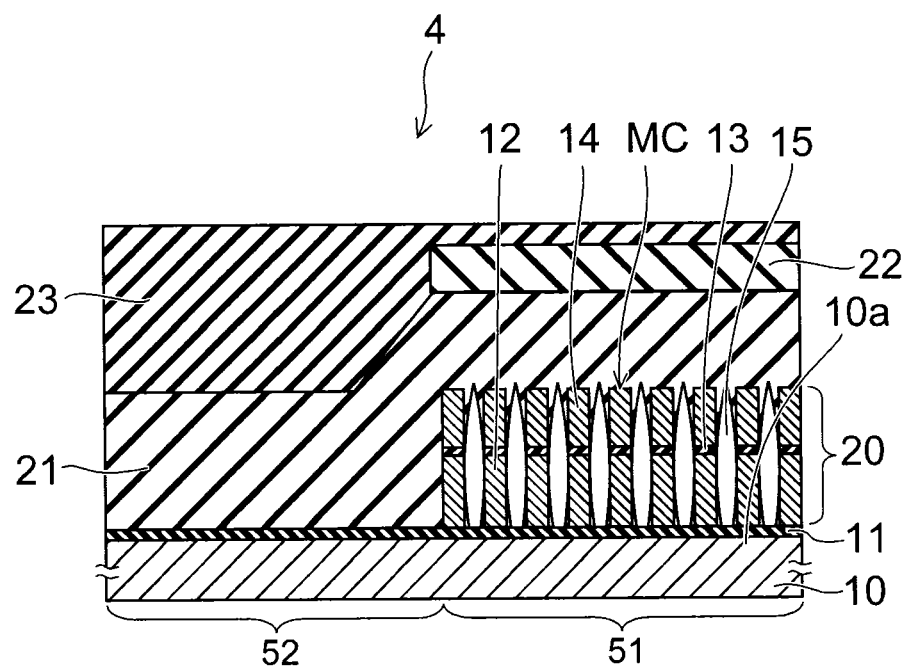

FIG. 6B is a schematic cross-sectional view of a semiconductor device 4 of a fourth embodiment.

In the semiconductor device 4 of the fourth embodiment as well, similarly to the second and third embodiments, the substrate 10 has the first region 51 where the foundation structure 20 is provided, and the second region 52 where the insulating film 21 is provided without the foundation structure 20 interposed.

Similarly to the third embodiment, a stacked film is provided on the foundation structure 20, where the stacked film includes the insulating film 22, which has the relatively low Young's modulus, interposed between the insulating film 21 and the insulating film 23, which have the Young's moduli that are higher than that of the insulating film 22.

However, the fourth embodiment differs from the third embodiment in that the insulating film 22 is not provided on the second region 52 and is provided only in the first region 51.

In other words, in the first region 51, the insulating film 21 is provided on the foundation structure 20; the insulating film 22 is provided on the insulating film 21; and the insulating film 23 is provided on the insulating film 22.

In the second region 52, the foundation structure 20 is not provided; the insulating film 21 is provided on the substrate 10 with the insulating film 11 interposed; and the insulating film 23 is provided on the insulating film 21 without the insulating film 22 being provided on the insulating film 21.

A stepped portion caused by the existence and absence of the foundation structure 20 forms in the surface of the insulating film 21. First, the insulating film 22 is formed on the entire surface of the surface of the insulating film 21 with a film thickness of 70 nm. Subsequently, lithography using a not-shown resist film and dry etching are performed to remove the insulating film 22 in the second region 52 and leave the insulating film 22 only in the first region 51.

Subsequently, as shown in FIG. 6A, the insulating film 23 is formed on the insulating film 21 of the second region 52 and on the insulating film 22 of the first region 51 with a film thickness of 180 nm. The insulating film 23 is formed along the surface step of the insulating film 21; and a stepped portion that reflects the surface step of the insulating film 21 forms in the surface of the insulating film 23.

Similarly to the embodiment recited above, CMP is performed on the stacked body (the wafer) shown in FIG. 6A because the surface step causes pattern defects in the lithography of the interconnect layer formation process of the upper layer and metal residue in the CMP process.

In the CMP apparatus shown in FIG. 7 described above, the wafer W having the stacked structure shown in FIG. 6A which is the object to be polished is held by the polishing head 33 with the surface to be polished (the insulating film 23 surface) of the wafer W opposing the polishing pad 32.

Then, the wafer W which is rotating as a single body with the polishing head 33 is polished by being pressed onto the upper surface of the rotating polishing pad 32; and the surface of the insulating film 23 is planarized as shown in FIG. 6B.

In the fourth embodiment as well, the insulating film 22 which has the Young's modulus that is lower than that of the silicon oxide film, that is, is softer than the silicon oxide film, is provided on the foundation structure 20 including the gaps 15. Therefore, the load applied to the wafer by the insulating film 22 deforming in the CMP process is absorbed; and the stress on the gaps 15 provided under the insulating film 22 is reduced. The reduction of the stress applied to the gaps 15 suppresses the occurrence of the cracks; and the semiconductor device 4 having high reliability can be provided.

In the fourth embodiment as well, from an examination based on the simulation results of FIG. 2B and FIG. 4 described above, it is desirable for the Young's modulus of the insulating film 22 to be not more than 30 GPa and not less than a hardness (a Young's modulus) that is high enough that the insulating film 22 does not peel in the CMP process.

Also, because the insulating film 22, which is softer than the silicon oxide film and has a lower mechanical strength than the silicon oxide film, is locally provided only on the foundation structure 20 including the gaps 15 in the fourth embodiment, the insulating film 22 can be more difficult to peel in the CMP process than for a structure in which the insulating film 22 is provided on the entire surface of the wafer.

The deformation of the insulating film 21 in the CMP is suppressed by the insulating film 21 that is directly above the gaps 15 being harder than the insulating film 22; and the stress on the gaps 15 can be suppressed.

The irregular polishing due to the polishing liquid having water as the solvent being undesirably repelled on the surface to be polished can be suppressed because the insulating film 23 which is to be polished is the silicon oxide film and is more hydrophilic than the insulating film 22 which includes the material such as the SiOC, the organic polymer material, the organosilicon material, etc.

Although the insulating film 22 is provided on the entire surface of the foundation structure 20 including the gaps 15 in the fourth embodiment, the resistance to the peeling of the insulating film 22 in the CMP process can be improved by providing the insulating film 22 only in a portion (the region of a portion of the first region 51) on the foundation structure 20. For example, a form may be considered in which the insulating film 22 is disposed in a rectangular configuration on the foundation structure 20, etc.

Although the memory cells MC are illustrated as the circuit components that have the interposed gaps 15 as an example in the embodiments described above, the circuit components for which the capacitive coupling is reduced by interposing the gaps 15 are not limited to the memory cells MC and may be interconnect layers. Also, the foundation structure may have the gaps 15 provided in element-separating regions.

Similarly to the embodiments recited above, by providing the insulating film 22 having the Young's modulus that is lower than that of the silicon oxide film on the foundation structure, even in the cases of the foundation structure in which the gaps 15 are provided between the interconnect layers or the foundation structure in which the gaps 15 are provided in the element-separating regions, the stress applied to the gaps 15 in the CMP can be reduced; and the occurrence of the cracks can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a substrate;
   a foundation structure provided on the substrate, the foundation structure including a plurality of circuit components and a gap provided between the circuit components;
   a first insulating film provided on the foundation structure, the first insulating film covering an upper end of the gap; and
   a second insulating film provided on the first insulating film, a Young's modulus of the second insulating film being lower than a Young's modulus of the first insulating film and a Young's modulus of a silicon oxide film.

2. The device according to claim 1, further comprising a third insulating film provided on the second insulating film, a Young's modulus of the third insulating film being higher than the Young's modulus of the second insulating film.

3. The device according to claim 1, wherein
   the substrate has a first region and a second region, the gap being provided in the first region, the first insulating film being provided on the substrate in the second region without the gap interposed, and
   the second insulating film is provided locally in a region of at least a portion of the first region.

4. The device according to claim 1, wherein the second insulating film has a Young's modulus of not more than 30 GPa.

5. The device according to claim 1, wherein the first insulating film is a silicon oxide film.

6. The device according to claim 1, wherein the second insulating film is an organic polymer film, an organosilicon film, or a SiOC film.

7. The device according to claim 2, wherein the third insulating film is a silicon oxide film.

8. The device according to claim 1, wherein the circuit components are memory cells including charge storage layers.

9. A semiconductor device, comprising:
   a substrate;
   a foundation structure provided on the substrate, the foundation structure including a plurality of circuit components and a gap provided between the circuit components;
   a first insulating film provided on the foundation structure, the first insulating film covering an upper end of the gap;
   a second insulating film provided on the first insulating film, a Young's modulus of the second insulating film being lower than a Young's modulus of the first insulating film and not more than 30 GPa;
   a third insulating film provided on the second insulating film, a Young's modulus of the third insulating film being higher than the Young's modulus of the second insulating film; and
   an interconnect layer buried into the third insulating film.

10. The device according to claim 9, wherein
    the substrate has a first region and a second region, the gap being provided in the first region, the first insulating film being provided on the substrate in the second region without the gap interposed; and
    the second insulating film is provided locally in a region of at least a portion of the first region.

11. The device according to claim 9, wherein the first insulating film is a silicon oxide film.

12. The device according to claim 9, wherein the second insulating film is an organic polymer film, an organosilicon film, or a SiOC film.

13. The device according to claim 9, wherein the third insulating film is a silicon oxide film.

14. The device according to claim 9, wherein the circuit components are memory cells including charge storage layers.

15. A method for manufacturing a semiconductor device, comprising polishing a surface of a wafer by CMP (chemical mechanical polishing), the wafer including:
    a substrate;
    a foundation structure provided on the substrate, the foundation structure including a plurality of circuit components and a gap provided between the circuit components;
    a first insulating film provided on the foundation structure, the first insulating film covering an upper end of the gap; and
    a second insulating film provided on the first insulating film, a Young's modulus of the second insulating film being lower than a Young's modulus of the first insulating film and a Young's modulus of a silicon oxide film.

16. The method according to claim 15, wherein
    a third insulating film is formed on the second insulating film, the third insulating film being more hydrophilic than the second insulating film, and
    a surface of the third insulating film is polished to be planarized.

17. The method according to claim 15, wherein the first insulating film is a silicon oxide film.

18. The method according to claim 15, wherein the second insulating film is an organic polymer film, an organosilicon film, or a SiOC film.

19. The method according to claim 16, wherein the third insulating film is a silicon oxide film.

* * * * *